United States Patent [19]
Lee

[11] Patent Number: 5,038,368
[45] Date of Patent: Aug. 6, 1991

[54] REDUNDANCY CONTROL CIRCUIT EMPLOYED WITH VARIOUS DIGITAL LOGIC SYSTEMS INCLUDING SHIFT REGISTERS

[75] Inventor: Swye N. Lee, Lawrenceville, N.J.

[73] Assignee: David Sarnoff Research Center, Inc., Princeton, N.J.

[21] Appl. No.: 473,751

[22] Filed: Feb. 2, 1990

[51] Int. Cl.[5] .................. H01H 37/76; G06F 11/16
[52] U.S. Cl. ............................. 377/28; 307/202.1; 307/219; 307/441; 371/8.1; 365/200; 377/68
[58] Field of Search .................. 307/202.1, 219, 441; 371/8.1, 8.2, 9.1, 10.1; 365/200; 377/28, 68

[56]       References Cited
          U.S. PATENT DOCUMENTS

| | | | |
|---|---|---|---|
| 4,613,959 | 9/1986 | Jiang | 371/10.1 |
| 4,614,881 | 9/1986 | Yoshida et al. | 307/219 |
| 4,641,285 | 2/1987 | Sasaki et al. | 307/441 |
| 4,714,839 | 12/1987 | Chung | 307/441 |
| 4,775,976 | 10/1988 | Yokoyama | 371/8.2 |
| 4,849,657 | 7/1989 | Boisevert | 307/441 |

OTHER PUBLICATIONS

IBM Tech. Disclosure Bul., vol. 20, No. 4 (9-1977), "Fuse State Detector & Inverter", by Thoma.

Primary Examiner—John S. Heyman
Attorney, Agent, or Firm—William J. Burke

[57]            ABSTRACT

A redundancy circuit that substitutes a redundant circuit element for a corresponding defective circuit element includes a severable fuse link and a redundancy control circuit with an input connected to the severable fuse link and first and second outputs. When the fuse link is intact, the first output of the redundancy control circuit is in a first state and the second output is in a second state. When the fuse link is severed, a momentary signal on power up places the first output in the second state and the second output in the first state. The first output is coupled to the one circuit element and the second output is coupled to the corresponding redundant circuit element. If the one circuit element is defective, it is disabled by severing the fuse link.

22 Claims, 3 Drawing Sheets

REDUNDANCY CONTROL CIRCUIT EMPLOYED WITH VARIOUS DIGITAL LOGIC SYSTEMS INCLUDING SHIFT REGISTERS

This invention was made with Government support under Contract No. F33615-88-C-1825 awarded by the Department of the Air Force. The Government has certain rights in this invention.

FIELD OF THE INVENTION

The invention relates to circuit arrays employing redundancy and, more particularly, to selection and control in arrays of redundant circuits.

BACKGROUND OF THE INVENTION

Many types of logic, memory and display systems utilize arrays of bulk type or thin film semiconductor circuits having thousands of elements interconnected on individual wafers or substrates. As the number of circuit elements on a wafer or substrate interconnected to perform a logic, memory or display function becomes larger, the probability of a defective circuit element increases. As a result, the entire wafer may be rendered useless. If the number of flawed wafers is large, the wafer yield is low and implementation of the logic, memory or display function may be considered too costly.

One technique that has been found effective to improve wafer yield is the use of redundant circuit elements (i.e., the addition of circuit elements on the wafer that may be substituted for defective circuit elements). After wafer fabrication is completed, defective elements are located. The interconnections are then altered to replace the defective element with a redundant element. In many situations, however, the interconnections cannot be readily changed. It is therefore necessary to provide redundant sub-functions that include a large number of circuit elements and apparatus to automatically select the sub-function elements that are to be used.

U.S. Pat. No. 4,714,839 (issued Dec. 22, 1987 to Shine C. Chung) discloses a control circuit for disabling or enabling the provision of redundancy in a memory circuit in which a dynamic latch is coupled to the output of a high-low-high circuit. The high-low-high circuit activates redundant elements in response to fuse controlled complementary address signals and includes a first fuse to enable the redundant elements and a second fuse to disable the redundant elements. While the redundant elements are automatically substituted for the defective elements, the arrangement requires a plurality of fuses and addressing elements so that it is relatively complex and is applicable only to line substitution in memory type functions. It is desired to provide a less complex substitution arrangement that controls a smaller set of redundant elements.

SUMMARY OF THE INVENTION

The invention is directed to a redundancy circuit having first and second circuit elements and a control element that disables one of the first and second circuit elements. The control element includes a severable fuse link and a redundancy control circuit with an input connected to the severable fuse link and first and second outputs. When the fuse link is intact, the first output of the redundancy control circuit is in a first state and the second output is in a second state. When the fuse link is severed, a momentary signal places the first output in the second state and the second output in the first state. The first output is coupled to the first circuit element and the second output is coupled to the second circuit element. In accordance with one aspect of the invention, each of the first and second circuit elements is a digital register having a gate at its output. The first state signal from the redundancy control circuit enables the gate of one of the digital registers and the second state signal disables the gate of the other digital register.

In an illustrative embodiment of the invention, a redundant shift register circuit has a plurality of shift registers each with a data input and a data output and a corresponding plurality of redundant shift registers each with a data input and a data output. A control circuit is responsive to a fusible link being intact to generate a first signal and produces a second signal when the fusible link is severed. Each shift register and its corresponding redundant shift register are controlled by one control circuit. The data output of a shift register coupled to the data inputs of the next successive shift register and the corresponding redundant shift register in response to the first signal from the control circuit and the data output of a redundant shift register is coupled to the data inputs of the next successive shift register and the corresponding redundant shift register in response to the second signal from the control circuit.

The invention will be better understood from the following more detailed description taken with the accompanying drawings and claims.

DETAILED DESCRIPTION

Figure 1:
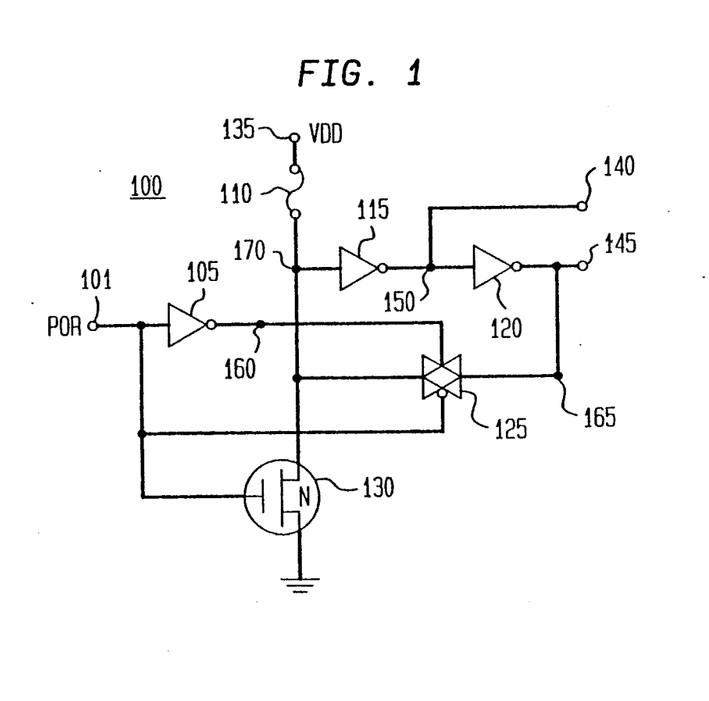
FIG. 1 is a schematic diagram of a redundancy control circuit in accordance with the present invention.

Referring now to FIG. 1, there is shown a redundancy control circuit 100 in accordance with the present invention. The redundancy control circuit 100 comprises an input terminal 101, inverters 105, 115 and 120, a transmission gate 125, an n-channel field effect transistor 130, a fuse link 110, output terminals 140 and 145 and voltage supply terminal 135. Transistor 130 is typically a metal-oxide-semiconductor (MOS) transistor having a gate, a source and a drain. The source electrode of transistor 130 is connected to a ground potential point, the gate electrode of transistor 130 is coupled to the input terminal 101, the drain electrode of transistor 130 is coupled to one end of fuse link 110, the input of inverter 115, one signal terminal (a first input/output terminal) of transmission gate 125 and to a node 170. The other end of fuse link 110 is connected to the supply terminal 135. The output of inverter 115 is coupled to the input of inverter 120 and to the output terminal 140. The output of inverter 120 is coupled to output terminal 145 and to a second signal terminal (a second input/output terminal) of transmission gate 125. The input terminal 101 is coupled to the input of inverter 105 and to inverted clock (control) input of transmission gate 125. The output of inverter 105 is coupled to a second direct clock (control) input of transmission gate 125 and to a node 160. The transmission gate 125 is closed when the direct clock input (node 160) is a high voltage level (i.e., a logical one, "1", and the inverted (complement) clock input (terminal 101) is a low voltage level (i.e., a logical zero, "0").

In operation, inverters 115 and 120 and transmission gate 125 form a dynamic store which is in one state when fuse link 110 is connected between supply terminal 135 and node 170 at the input of inverter 115 and is in the opposite state when fuse link 110 is severed by a laser cut or other means. Terminal 101 is normally at a low voltage, i.e. a logical zero, level. The logical zero signal from terminal 101 is applied to the input of inverter 105, the gate electrode of transistor 130 and the complement clock input of transmission gate 125. Transistor 130 is disabled (turned off) by the logical zero signal at its gate electrode.

If fuse link 110 is not severed, the supply voltage VDD is coupled through the fuse link 110 to the drain electrode of transistor 130. Node 170 connected to the drain electrode is therefore at a logical one, i.e. high voltage level. The output of inverter 105 is a logical one in response to the logical zero at its input and transmission gate 125 is closed in response to the logical one at the clock input from the output of inverter 105 and the logical zero from terminal 101. Since the input of inverter 115 is a logical one, its output is a logical zero and the output of inverter 120 is a logical one. Transmission gate 125 couples the logical one at output of inverter 120 to the input of inverter 115.

A momentary logical one pulse POR is applied to terminal 101 when the circuit is turned on. The logical one pulse from terminal 101 causes the clock inputs to transmission gate 125 to reverse so that a logical zero is applied to the clock input of the transmission gate from inverter 105 and a logical one is supplied to the complement clock input from terminal 101. Transmission gate 125 is open during the logical one POR pulse. Transistor 130 is enabled (turned on) by the logical one POR pulse. The impedance of fuse link 110 is low so that the drain electrode of transistor 130 remains at the logical one level. As a result, the input to inverter 115 remains a logical one. Its output is a logical zero and the output of inverter 120 is a logical one. When pulse POR terminates, terminal 101 returns to its normal logical zero level and transmission gate 125 is closed in response to the logical one from the output of inverter 105 and the logical zero from terminal 101 at its clock inputs.

If the fuse link 110 is severed, the momentary logical one POR pulse at terminal 101 opens transmission gate 125 and enables transistor 130 as previously described. In the absence of fuse link 110, the drain electrode of enabled transistor 130 becomes a logical zero. The output of inverter 115 changes to a logical one in response to the logical zero at the drain electrode of transistor 130. The output of inverter 120 then changes to a logical zero. Transistor 130 is disabled and transmission gate 125 is closed when the POR pulse terminates. As a result, the logical zero at the output of inverter 120 is coupled through transmission gate 125 to the input of inverter 115. Redundancy control circuit 100 of FIG. 1 is placed in one state by the momentary power on pulse POR if the fuse link 110 is in place and is placed in the opposite state by the momentary power on pulse POR if the fuse link 110 has been severed. The complement signals at the output terminals 140 and 145 may then be used to enable or disable alternative circuit elements or arrays of circuit elements.

Figure 2:
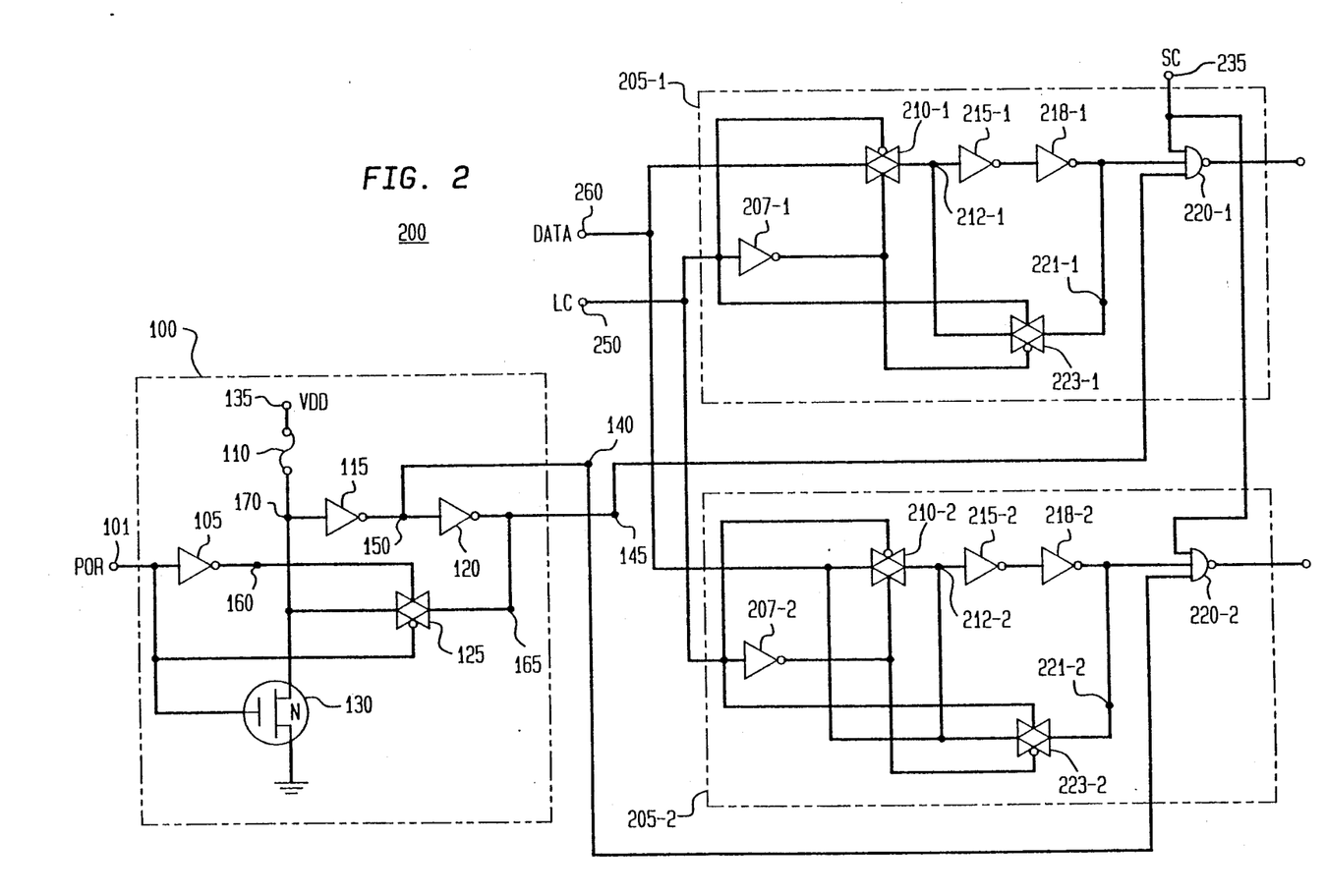
FIG. 2 is a schematic and block diagram of a redundancy arrangement for a digital register incorporating the redundancy control circuit of FIG. 1.

Referring now to FIG. 2, there is shown a redundant digital register circuit 200 in accordance with the invention. Circuit 200 uses the redundancy control circuit 100 of FIG. 1. The digital register circuit 200 comprises the redundancy control circuit 100, digital register circuits 205-1 and 205-2 (both shown in dashed line rectangles), and signal terminals 250 and 260. The digital register circuit 205-1 comprises inverters 207-1, 215-1 and 218-1, transmission gates 210-1 and 223-1 and a NAND gate 220-1. Redundant digital register circuit 205-2 comprises inverters 207-2, 215-2 and 218-2, transmission gates 210-2 and 223-2 and NAND gate 220-2.

The output terminal 145 of redundancy control circuit 100 is coupled to a first input of NAND gate 220-1 in digital register 205-1. The output terminal 140 of redundancy control circuit 100 is coupled to a first input of NAND gate 220-2 in digital register 205-2. In digital register 205-1, an output of inverter 215-1 is coupled to an input of inverter 218-1. The output of inverter 218-1 is coupled to a second input of NAND gate 220-1, to a first signal terminal of transmission gate 223-1 and to a node 221-1. A second signal terminal of transmission gate 223-1 is coupled to an input of inverter 215-1, to a second signal terminal of transmission gate 210-1 and to a node 212-1. A third input of the NAND gate 220-1 is coupled to a signal terminal 235. A signal terminal 250 is coupled to an input of inverter 207-1, to a direct clock input of transmission gate 223-1 and to a complement (inverter) clock input of transmission gate 210-1. The output of inverter 207-1 is coupled to the direct clock input of transmission gate 210-1 and to the complement clock input of transmission gate 223-1. A first signal terminal of transmission gate 210-1 is coupled to the signal terminal 260.

In digital register 205-2, an output of inverter 215-2 is coupled to an input of inverter 218-2. An output of inverter 218-2 is coupled to second input of NAND gate 220-2, to a first signal terminal of transmission gate 223-2 and to a node 221-2. A second signal terminal of transmission gate 223-2 is coupled to an input of inverter 215-2, to a second signal terminal of transmission gate 210-2 and to an input of inverter 215-2. A third input of NAND gate 220-2 is coupled to the signal terminal 235. The signal terminal 250 is coupled to an input of inverter 207-2, to a direct clock input of transmission gate 223-2 and to the complement clock input of transmission gate 210-2. An output of inverter 207-2 is coupled to a direct clock input of transmission gate 210-2 and to a complement clock input of transmission gate 223-2. A first signal terminal of transmission gate 210-2 is coupled to the signal terminal 260.

Registers 205-1 and 205-2 receive a data signal DATA from terminal 260 when load clock signal at terminal 250 is a logical zero. Redundancy control circuit 100 provides a logical one signal to NAND gate 220-1 and a logical zero signal to NAND gate 220-2 when fuse link 110 completes the path from terminal 135 to the drain electrode of transistor 130. Fuse link 110 is left intact if normal register 205-1 is tested successfully so that the signal at terminal 140 is a logical zero and the signal at terminal 145 is a logical one. If register 205-1 is found to be defective, fuse line 110 is laser cut. The signal at terminal 140 after momentary pulse POR is a logical one and the signal at terminal 145 is a logical zero. NAND gate 220-1 in Register 205-1 is disabled by the logical zero signal from terminal 145 and NAND gate 220-2 in redundant register 205-2 is enabled by the logical one signal from terminal 140.

For purposes of illustration, it is assumed that normal register 205-1 has been successfully tested and fuse link 110 is left intact. When power is turned on, the logical one pulse POR is applied to terminal 101. Transistor 130 is enabled by the logical one signal at its gate electrode but its drain electrode remains at the logical one level as a result of the low impedance of fuse link 110. Transmission gate 125 is opened in response to the logical one POR pulse. The logical one signal at the input of inverter 115 produces a logical zero signal at its output and at terminal 140. Inverter 120 receives the logical zero signal from inverter 115 and produces a logical one signal at its output and at terminal 145. Upon the termination of pulse POR, transmission gate 125 closes and the logical one at the output of inverter 120 is coupled to the input of inverter 115.

The logical one signal from terminal 145 enables NAND gate 220-1 in register 205-1. Terminal 250 is normally at a logical one level and this logical one level is coupled to the direct clock input of transmission gate 223-1, the complement clock input of transmission gate 210-1 and the input of inverter 207-1. The resulting logical zero signal on the output of inverter 207-1 is supplied to the direct clock input of transmission gate 210-1 and the complement clock input of transmission gate 223-1. In this way, transmission gate 223-1 is normally closed and transmission gate 210-1 is normally open. Consequently, a data bit is stored in the circuit loop through inverters 215-1 and 218-1 and transmission gate 223-1.

When a logical zero load clock signal LC is applied to terminal 250, transmission gate 223-1 is opened by the logical zero on its direct clock input from terminal 250 and the logical one on its complement clock input from the output of inverter 207-1. Transmission gate 210-1 is closed by the logical one on its direct clock input from terminal 260 and the logical zero on its complement clock input from inverter 207-1. The data signal DATA, e.g. a logical one, is then coupled to the input of inverter 215-1 and therefrom through inverter 218-1 to transmission gate 223-1. Upon the termination of load clock signal LC, terminal 250 returns to its logical one level. Transmission gate 210-1 opens and transmission gate 223-1 closes. The Data signal is then stored in register 205-1. If it is a logical one, the output of inverter 215-1 is a logical zero and the output of inverter 220-1 and one input of NAND gate 220-1 is a logical one. The stored data signal appears on the output of NAND gate 220-1 in response to synchronizing signal SC on terminal 235. NAND gate 220-2 in redundant register 205-2 receives the logical zero signal from terminal 140 so that its output is set to a logical one. As a result, the output of redundant register 205-2 from NAND gate 220-2 is rendered ineffective.

In the event that normal register 205-1 is found to be defective during testing of the substrate, fuse link 110 is laser cut or otherwise disabled. In this way, supply terminal 135 is disconnected from node 170. When momentary a logical one pulse POR is coupled to the gate electrode of transistor 130, it is enabled and its drain electrode is set to the logical zero level. Transmission gate 125 is opened by the logical one coupled from terminal 101 to its complement clock input and the logical zero coupled to its direct clock input from inverter 105. The input of inverter 115 receives the logical zero from the drain electrode of transistor 130 so that its output is set to a logical one and the output of inverter 120 is set to a logical zero. When pulse POR terminates, transmission gate 125 closes. The logical zero output of inverter 120 is coupled to the input of inverter 115 so that terminal 140 is set to a logical one and terminal 145 is set to a logical zero. Consequently, NAND gate 220-1 in normal register 205-1 receives a logical zero signal from terminal 145 and its output is fixed at the logical one. One input of NAND gate 220-2 in redundant register 205-2 receives a logical one signal from terminal 140. When a logical zero load clock signal LC is applied to terminal 250, transmission gate 223-2 is opened by the logical zero on its direct clock input from terminal 250 and the logical one on its complement clock input from the output of inverter 207-2. Transmission gate 210-2 is closed by the logical one on its direct clock input from terminal 260 and the logical zero on its complement clock input from inverter 207-2. The data signal DATA, e.g. a logical one, is then coupled to the input of inverter 215-2 and therefrom through inverter 218-2 to transmission gate 223-2. Upon the termination of load clock signal LC, terminal 250 returns to its logical one level. Transmission gate 210-2 opens and transmission gate 223-2 closes. The Data signal is then stored in register 205-2. If it is a logical one, the output of inverter 215-2 is a logical zero as well as the output of inverter 220-2 and one input of NAND gate 220-2 is a logical one. The stored data signal appears on the output of NAND gate 220-2 in response to synchronizing signal SC on terminal 235. While only one register and one redundant register are shown in FIG. 2, it is apparent the a plurality of such register pairs may be used and that each or several of the register pairs may be controlled by a redundancy control circuit. In this way, one or more small circuit elements such as register stages may be separately substituted for defective circuit elements to improve wafer yield.

Figure 3:
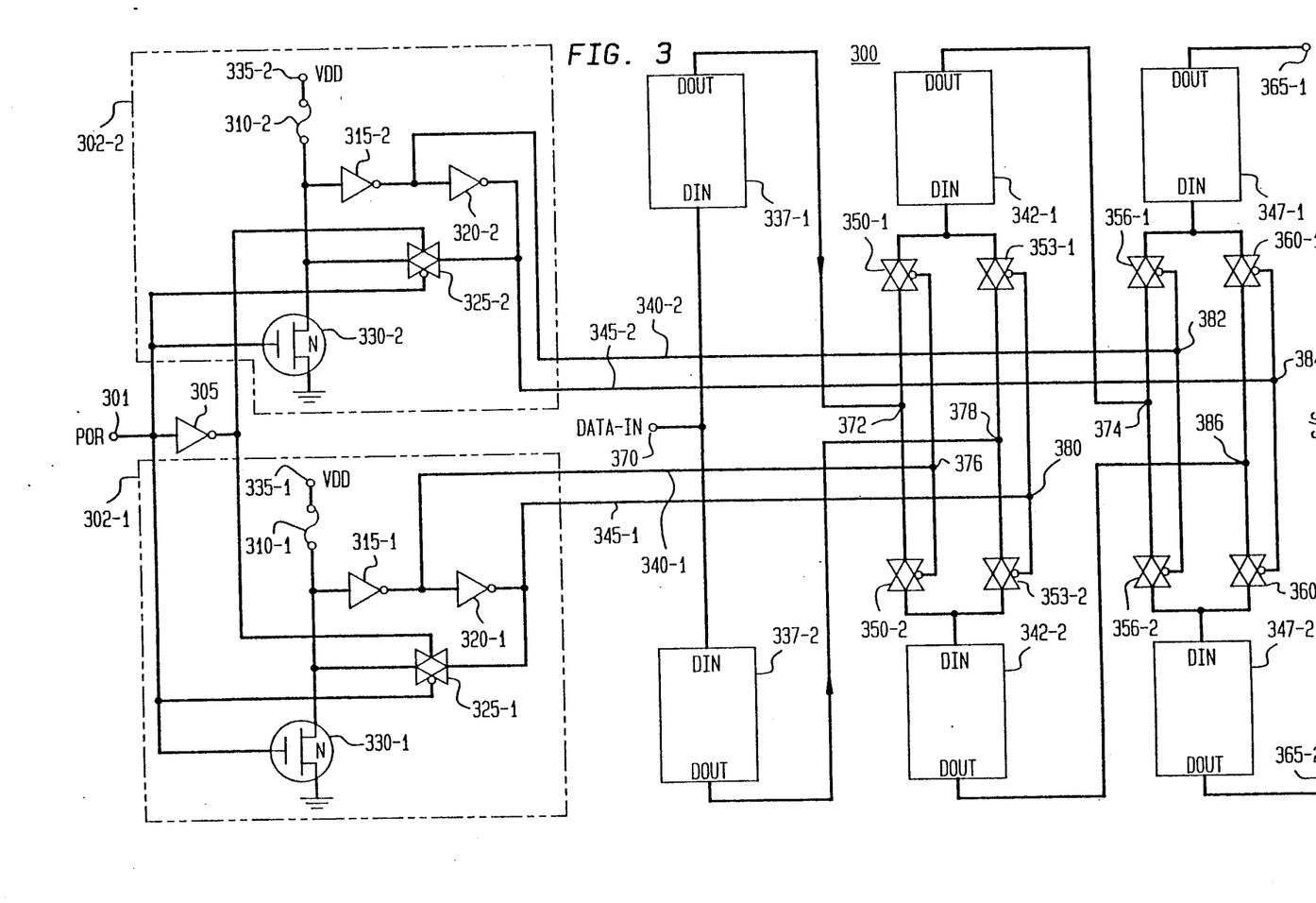
FIG. 3 is a schematic and block diagram the redundancy arrangement for a shift register incorporating the redundancy control circuit of FIG. 1.

Referring to FIG. 3, there is shown a redundant shift register circuit 300 incorporating the redundancy control circuit of FIG. 1. The redundant shift register 300 comprises signal terminal 301, inverter 305, redundancy control circuits 302-1 and 302-2, shift registers 337-1, 342-1 and 347-1, redundant shift registers 337-2, 342-2, and 347-2, one way transmission gates 350-1, 350-2, 353-1, 353-2, 356-1, 356-2, 360-1 and 360-2, data input terminal 370 and data output terminals 365-1 and 365-2. Redundancy control circuit 302-1 comprises inverters 315-1 and 320-1, transmission gate 325-1, an n-channel MOS transistor 330-1, a fuse link 310-1, output terminals 340-1 and 345-1 and voltage supply terminal 335-1. Redundancy control circuit 302-2 comprises inverters 315-2 and 320-2, transmission gate 325-2, an n-channel MOS transistor 330-2, a fuse link 310-2, output terminals 340-2 and 345-2 and voltage supply terminal 335-2. Each of shift registers 337-1, 342-1, 347-1 and redundant shift registers 337-2, 342-2, and 347-2 may comprise one or more shift register stages.

In the redundant shift register 300, signal terminal 301 is coupled to the input of inverter 305, the complement clock input of transmission gate 325-1 in redundancy control circuit 302-1 and the complement clock input of transmission gate 325-2 in redundancy control circuit 302-2. The output of inverter 305 is coupled to the direct clock input of transmission gate 325-1 in redundancy control circuit 302-1 and the direct clock input of transmission gate 325-2 in redundancy control circuit 302-2. Terminal 340-1 is coupled to the complement clock inputs of transmission gates 350-1 and 350-2 and to a node 376. Terminal 345-1 is coupled to the complement clock inputs of transmission gates 353-1 and 353-2 and to a node 380. Terminal 340-2 is coupled to the complement clock inputs of transmission gates 356-1 and 356-2 and to a node 382. Terminal 345-2 is coupled to the complement clock inputs of transmission gates 360-1 and 360-2 and to a node 384.

DATA IN terminal 370 is coupled to the DIN inputs of shift register stages 337-1 and 337-2. The DOUT output of shift register stage 337-1 is connected to node 372 and therefrom to the signal inputs of transmission gates 350-1 and 350-2. The DOUT output of shift register stage 337-2 is coupled to node 378 and therefrom to the signal inputs of transmission gates 353-1 and 353-2. The signal outputs of transmission gates 350-1 and 353-1 are coupled to the DIN input of shift register 342-1. The signal outputs of transmission gates 350-2 and 353-2 are coupled to the DIN input of shift register stage 342-2. The DOUT terminal of shift register stage 342-1 is coupled to node 374 and therefrom to the signal inputs of transmission gates 356-1 and 356-2. The DOUT terminal of shift register stage 342-2 is coupled to node 386 and therefrom to the signal inputs of transmission gates 360-1 and 360-2. The signal outputs of transmission gates 356-1 and 360-1 are coupled to the DIN input of shift register stage 347-1 and the signal outputs of transmission gates 356-2 and 360-2 are coupled to the DIN input of shift register stage 347-2. The DOUT output of shift register stage 347-1 is coupled to output terminal 365-1 and the DOUT output of shift register stage 347-2 is coupled to output terminal 365-2.

In redundancy control circuit 302-1, the source electrode of transistor 330-1 is connected to ground potential. The drain electrode of transistor 330-1 is coupled to one end of fuse link 310-1, the input of inverter 315-1, and one signal terminal of transmission gate 325-1. The other end of fuse link 310-1 is connected to supply terminal 335-1. The output of inverter 315-1 is coupled to the input of inverter 320-1 and output terminal 340-1. The output of inverter 320-1 is coupled to output terminal 345-1 and the other signal terminal of transmission gate 325-1. In redundancy control circuit 302-2, the source electrode of transistor 330-2 is connected to ground potential. The drain electrode of transistor 330-2 is coupled to one end of fuse link 310-2, the input of inverter 315-2, and one signal terminal of transmission gate 325-2. The other end of fuse link 310-2 is connected to supply terminal 335-2. The output of inverter 315-2 is coupled to the input of inverter 320-2 and output terminal 340-2. The output of inverter 320-2 is coupled to output terminal 345-2 and the other signal terminal of transmission gate 325-2.

In a preferred embodiment the redundant shift register circuit 300 of FIG. 3 is fabricated on a glass substrate of a liquid crystal display and thin film transistors are used. The shift register arrangement, for example, may be part of an panel display employing a liquid crystal device. Redundancy control circuits 302-1 and 302-2 are substantially similar to the redundancy control circuit 100 of FIG. 1. Terminal 301 is normally at a logical zero level. Transistors 330-1 and 330-2 are disabled by the logical zero signals at their gate electrodes and transmission gates 325-1 and 325-2 are closed by the logical zero signal from terminal 301 applied to their complement clock inputs and the logical one signal from the output of inverter 305 applied to their direct clock inputs.

Assume for purposes of illustration that fuse link 310-1 in redundancy control circuit 302-1 is intact and fuse link 310-2 in redundancy control circuit 302-2 is severed. In redundancy control circuit 302-1, the drain electrode of disabled transistor 330-1 and the input of inverter 315-1 are held at a logical one level by the VDD voltage applied to terminal 335-1. A logical zero appears at the output of inverter 315-1 and a logical one appears at the output of inverter 320-1. The logical one from the output of inverter 320-1 is coupled to the input of inverter 315-1 through closed transmission gate 325-1. When the redundant shift register 300 is powered up, pulse POR opens transmission gate 325-1 and enables transistor 330-1. The low impedance of fuse link 310-1, however, keeps the drain electrode of transistor 330-1 at the logical one level. Consequently, the outputs of inverters 315-1 and 320-1 do not change during or after the POR pulse terminates.

In redundancy control circuit 302-2, fuse link 310-2 has been severed. When the POR pulse is applied, transistor 330-2 is enabled and its drain electrode is set to the logical zero level. A logical one appears at the output of inverter 315-2 and a logical zero appears at the output of inverter 320-2. After the termination of the POR pulse, The logical zero from the output of inverter 320-2 is coupled to the input of inverter 315-2 through closed transmission gate 325-2 and the outputs of inverters 315-2 and 320-2 remain unchanged.

Redundancy control circuit 302-1, when fuse link 310-1 is intact, controls transmission gates 350-1,350-2, 353-1 and 353-2 to direct the data output DOUT of shift register stage 337-1 to the data inputs DIN of shift register stages 342-1 and 342-2. When fuse link 310-1 is severed, redundancy control circuit 302-1 controls transmission gates 350-1,350-2, 353-1 and 353-2 to direct the data output DOUT of shift register stage 337-2 to the data inputs DIN of shift register stages 342-1 and 342-2. Redundancy control circuit 302-2, when fuse link 310-2 is intact, controls transmission gates 356-1, 356-2, 360-1 and 360-2 to direct the data output DOUT of shift register stage 342-1 to the data inputs DIN of shift register stages 347-1 and 347-2. When fuse link 310-2 is severed, redundancy control circuit 310-2 controls transmission gates 356-1, 356-2, 360-1 and 360-2 to direct the data output DOUT of shift register stage 342-2 to the data inputs DIN of shift register stages 347-1 and 347-2. Prior art arrangements permitted the substitution of one group of shift registers for a group of shift registers having a defect therein. In accordance with the present invention, one of shift registers 337-1 or 337-2 may be used in combination with a selected one of shift registers 342-1 and 342-2 and a selected one of shift registers 347-1 and 347-2 to provide successful overall shift register operation. Since any combination of shift registers is possible in redundant shift register 300, wafer yield is substantially increased. The improved yield is particularly useful in where the wafer or substrate also includes other devices such as found in panel displays and where deposited thin film devices may be used.

Redundancy control circuit 302-1 operates to determine which of shift registers 337-1 and 337-2 are coupled to shift registers 342-1 and 342-2. If fuse link 310-1 is intact, a logical zero signal is coupled to the complement clock inputs of transmission gates 350-1 and 350-2 from terminal 340-1 and these transmission gates are closed. A logical one signal is coupled to the complement clock inputs of transmission gates 353-1 and 353-2 from terminal 345-1 so that these transmission gates are open. The DOUT data output from shift register 337-1 is thereby coupled to the DIN data inputs of shift registers 342-1 and 342-2 through transmission gates 350-1 and 350-2. In the event that shift register 337-1 is defective, fuse link 310-1 is severed. A logical one signal is coupled to the complement clock inputs of transmission gates 350-1 and 350-2 from terminal 340-1 and these transmission gates are open. A logical zero signal is coupled to the complement clock inputs of transmission gates 353-1 and 353-2 from terminal 345-1 so that these transmission gates are closed. The DOUT data output from shift register 337-2 is thereby coupled to the DIN data inputs of shift registers 342-1 and 342-2 through transmission gates 353-1 and 353-2. In this way, the defective shift register 337-1 is replaced by redundant shift register 337-2.

Redundancy control circuit 302-2 operates to determine which of shift registers 342-1 and 342-2 are coupled to shift registers 347-1 and 347-2. If fuse link 310-2 is intact, a logical zero signal is coupled to the complement clock inputs of transmission gates 356-1 and 356-2 from terminal 340-2 and these transmission gates are closed. A logical one signal is coupled to the complement clock inputs of transmission gates 360-1 and 360-2 from terminal 345-2 so that these transmission gates are open. The DOUT data output from shift register 342-1 is thereby coupled to the DIN data inputs of shift registers 347-1 and 347-2 through transmission gates 356-1 and 356-2. In the event that shift register 342-1 is defective, fuse link 310-2 is severed. A logical one signal is coupled to the complement clock inputs of transmission gates 356-1 and 356-2 from terminal 340-2 and these transmission gates are open. A logical zero signal is coupled to the complement clock inputs of transmission gates 360-1 and 360-2 from terminal 345-2 so that these transmission gates are closed. The DOUT data output from shift register 342-2 is thereby coupled to the DIN data inputs of shift registers 347-1 and 347-2 through transmission gates 360-1 and 360-2. In this way, the defective shift register 342-1 is replaced by redundant shift register 342-2. While redundant shift register circuit 300 shows three shift registers and three redundant shift registers, it is apparent from FIG. 3 that a more or fewer shift registers may be used without affecting the redundancy arrangement therein and that one redundancy control circuit may be used to control a plurality of shift registers.

Figure 4:
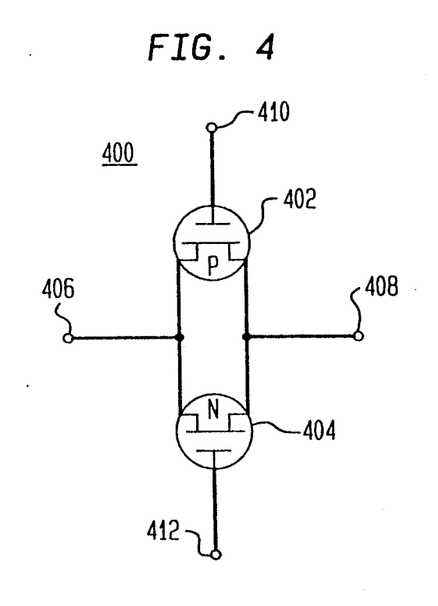
FIG. 4 is a schematic diagram illustrative of a transmission gate used in the circuits of FIGS. 1, 2 and 3.

Referring now to FIG. 4, there is shown a schematic diagram of a transmission gate circuit 400 that may be used was the transmission gates shown in FIGS. 1, 2 and 3. The transmission gate circuit 400 comprises a first signal (a first input/output) terminal 406, a second signal (a second input/output) terminal 408, direct clock terminal 412 and inverted clock terminal 412, p-channel field effect transistor 402 and n-channel field effect transistor 404. The signal terminal 406 is connected to the source electrode of transistor 402 and to the drain electrode of transistor 404. The signal terminal 408 is connected to the source electrode of transistor 404 and to the drain electrode of transistor 402. The gate electrode of transistor 402 is coupled to the inverted clock terminal 410 and the gate electrode of transistor 404 is coupled to direct clock terminal 412.

When the transmission gate 400 operates as a bidirectional transmission gate, the signals applied to clock terminals 410 and 412 are complementary. Thus when clock terminal 410 receives a logical one ("1"), clock terminal 412 receives a logical zero ("0") and when clock terminal 410 receives a "0", clock terminal 412 receives a "1". Transistors 402 and 404 are enabled when terminal 412 receives a "1" and terminal 410 receives a "0". When enabled, transmission gate 400 acts as a short or low impedance path between terminals 406 and 408 and is said to be closed. Conversely, transmission gate 400 is disabled when a "0" is applied to terminal 410 and a "1" applied to terminal 412. When disabled, transmission gate 400 acts an open circuit or high impedance path between terminals 406 and 408 and is said to be open. In this way, a bidirectional current path is established between signal terminals 406 and 408 in response to the clock signal at the gate electrode of p-channel transistor 402 being a "0" and the clock signal at the gate electrode of n-channel transistor 404 being a "1". If the clock signal on the gate electrode of p-channel transistor 402 is a "1" and the clock signal on the gate electrode of n-channel transistor 404 is a "0", the transistors 402 and 404 are disabled and there is no current between terminals 406 and 408. Transmission gates 350-1, 350-2, 353-1, 353-2, 356-1, 356-2, 360-1 and 360-2 in FIG. 3 are used as one way transmission gates so that only one of transistors 402 and 404 is enabled. Consequently, it is only necessary to enable one clock input as is shown in FIG. 3 with respect to transmission gates 350-1, 350-2, 353-1, 353-2, 356-1, 356-2, 360-1 and 360-2.

It is to be understood that the specific embodiments described herein are intended merely to be illustrative of the spirit and scope of the invention. Modifications can readily be made by those skilled in the art consistent with the principles of this invention. For example, the invention may be employed with circuit elements other than registers and shift registers.

What is claimed is:

1. A redundancy circuit comprising:
   a first circuit element;
   a second circuit element; and
   a redundancy control circuit for disabling one of the first and second circuit elements comprising:
   a severable fuse link having first and second terminals;
   means for receiving a momentary signal;
   a control circuit having an input and first and second output terminals;
   the second terminal of the severable fuse link being coupled to the control circuit input; and
   means connected to the second terminal of the severable fuse link responsive to the fuse link being intact for placing the first output terminal of the control circuit in a first state and the second output terminal of the control circuit in a second state and jointly responsive to a momentary signal applied to the receiving means and the fuse link being severed for placing the first output terminal of the control circuit in the second state and the second output terminal of the control circuit in the first state; and
   the first output terminal of the control circuit being coupled to the first circuit element and the second output terminal of the control circuit being coupled to the second circuit element.

2. The circuit of claim 1 wherein the control circuit comprises:
   first and second inverters each having an input and an output;
   the output of the first inverter being coupled to first output terminal of the control circuit;

the output of the second inverter being coupled to second output terminal of the control circuit;

the output of the first inverter being coupled to the input of the second inverter; and means for coupling the output of the second inverter to the input of the first inverter.

3. The circuit of claim 2 wherein:

the means for placing the first output terminal of the control circuit in the first state and the second output terminal of the control circuit in a second state and for placing the first output terminal of the control circuit in the second state and the second output terminal of the control circuit in the first state comprises:

semiconductor switching means having an output electrode and a control electrode the output electrode of the semiconductor switching means being connected to the second terminal of the fuse link; and the control electrode of the semiconductor switching means being coupled to the momentary receiving means.

4. The circuit of claim 3 further comprising:

means for receiving a first voltage;

the first terminal of the severable fuse link being coupled to the first voltage receiving means; and the output electrode of the semiconductor switching means being placed in a first voltage state responsive to the severable fuse link being intact and being placed in a second voltage state jointly responsive to the momentary signal at the control electrode of the semiconductor switching means and the fuse link being severed.

5. The circuit of claim 4 wherein the means for coupling the output of the second inverter to the input of the first inverter comprises gating means, which is coupled between the output of the second inverter and the input of the first inverter, responsive to the momentary signal for disconnecting the input of the first inverter from the output of the second inverter.

6. The circuit of claim 5 wherein the semiconductor switching means comprises:

a field effect transistor having a drain electrode and a gate electrode;

the output electrode of the semiconductor switching means being the drain electrode of the field effect transistor; and the control electrode of the switching means being the gate electrode of the field effect transistor.

7. The circuit of claim 6 wherein the field effect transistor is an n-channel field effect transistor.

8. The circuit of claim 7 wherein the n-channel field effect transistor is an n-channel thin film field effect transistor.

9. The circuit of claim 1 wherein:

the first circuit element comprises a first digital register having output gating means;

the second circuit element comprises a second digital register having output gating means;

the first output terminal of the control circuit being coupled to the output gating means of one of the first and second digital registers; and the second output terminal of the control circuit being coupled to the output gating means of the other of the first and second digital registers.

10. Redundancy control circuitry comprising:

first and second circuit elements;

a severable fuse link;

the redundancy control circuitry having an input terminal for receiving a monetary signal, a first output terminal coupled to the first circuit element, a second output terminal coupled to the second circuit element, and being adapted to disable one of the first and second circuit elements when the fuse link in intact and being adapted to disable the other of the first and second circuit elements when the fuse link is severed;

first and second inverters each having an input and an output;

means coupled to the redundancy control circuit input terminal for selectively coupling the output of the second inverter to the input of the first inverter;

the output of the first inverter being coupled to the input of the second inverter and to the first output terminal of the redundancy control circuitry;

the output of the second inverter being coupled to the second output terminal of the redundancy control circuitry; and a semiconductor switching means having an output electrode coupled to the fuse link and to the input of the first inverter, and having a control electrode coupled to the input terminal of the redundancy control circuitry.

11. The redundancy control circuitry of claim 10 wherein the semiconductor switching means is a field effect transistor.

12. The redundancy control circuitry of claim 11 wherein the field effect transistor is an n-channel insulated gate field effect transistor.

13. The redundancy control circuitry of claim 10 wherein the means coupled to the redundancy control circuit comprises a transmission gate.

14. The redundancy control circuitry of claim 13 wherein:

the transmission gate comprises a second and third field effect transistor which are complementary with each having a drain, a source and a gate;

the drain of the second transistor is coupled to the source of the third transistor and to the input of the first inverter;

the source of the second transistor is coupled to the drain of the third transistor and to the output of the second inverter; and the gate of one of the second and third transistors being coupled to the redundancy control circuitry input terminal, and the gate of the other of the second and third transistors being coupled through an inverter to the redundancy control circuitry input terminal.

15. Redundant shift register circuitry comprising:

first and second shift registers with each having at least first and second stages and with each stage having an input and an output;

a first pair of first and second coupling control circuits and a second pair of third and fourth coupling circuits with each of the coupling circuits having an input terminal, an output terminal and a control terminal;

the output of the first stage of the first shift register being coupled to the inputs of the first and second coupling control circuits;

the output of the first stage of the second shift register being coupled to the inputs of the third and fourth coupling control circuits;

the output terminals of the first and third coupling control circuits being coupled to the input of the second stage of the first shift register;

the output terminals of the second and fourth coupling control circuits being coupled to the input of the second stage of the second shift register;

a severable fuse link;

redundancy control circuitry having an input terminal for receiving a monetary signal, a first output terminal coupled to the control terminals of the first and second coupling control circuits, and a second output terminal coupled to the control terminals of the third and fourth coupling control circuits;

the redundancy control circuitry being adapted to disable one of the first and second pairs of coupling control circuits when the fuse link in intact and being adapted to disable the other pair of coupling control circuits when the fuse link is severed;

the redundancy control circuitry comprising:

first and second inverters each having an input and an output;

means coupled to the redundancy control circuit input terminal for selectively coupling the output of the second inverter to the input of the first inverter;

the output of the first inverter being coupled to the input of the second inverter and to the first output terminal of the redundancy control circuitry;

the output of the second inverter being coupled to the second output terminal of the redundancy control circuitry; and a semiconductor switching means having an output electrode coupled to the fuse link and to the input of the first inverter, and having a control electrode coupled to the input terminal of the redundancy control circuitry.

16. The redundancy control circuitry of claim 15 wherein the semiconductor switching means is a field effect transistor.

17. The redundancy control circuitry of claim 16 wherein the field effect transistor is an n-channel insulated gate field effect transistor.

18. The redundancy control circuitry of claim 16 wherein the means coupled to the redundancy control circuit input terminal comprises a first transmission gate and the first, second, third and fourth coupling control circuits comprise second, third, fourth and fifth transmission gates, respectively.

19. The redundancy control circuitry of claim 18 wherein each of the transmission gates comprises second and third field effect transistor which are complementary with each having a drain, a source and a gate.

20. Redundancy circuitry comprising:

a severable fuse link;

the redundancy circuitry having an input and first and second outputs with the first output being connectable to a first circuit element and the second output being connectable to a second circuit element;

the first and second circuit elements being essentially identical and each being adapted to be enabled by a first logic level and disabled by a second logic level;

a first control circuit having an input coupled to the input of the redundancy circuitry and having an output;

a second control circuit having first and second inputs and first and second outputs;

the first input of the second control circuit being coupled to the redundancy circuitry input terminal;

the second input of the second control circuit being coupled to the severable fuse link and to the output of the first control circuit;

the first and second outputs of the second control circuit being coupled to the first and second redundancy circuitry outputs, respectively;

the first control circuit being adapted upon receipt of a control signal applied to the input thereof to generate at the output thereof a first logic level when the severable fuse link is intact and to generate at the output thereof a second logic level when the severable link fuse is severed; and the second control circuit being adapted to generate a first set of complementary logic levels at the first and second redundancy circuitry output terminals upon receipt of the first logic level from the first control circuit and to generate a second set of complementary logic levels on the first and second outputs of the redundancy circuitry which are opposite to the first set of complementary logic levels.

21. The redundancy circuitry of claim 20 in which the second control circuit comprises:

first and second inverters each having an input and an output;

the output of the first inverter being coupled to the input of the second inverter and to the first redundancy circuitry output;

the output of the second inverter being coupled to the second redundancy circuitry output;

the input of the first inverter being coupled to the severable fuse link and to the output of the first control circuit;

a transmission gate connected between the output of the second inverter and the input of the first inverter; and the transmission gate having a control input coupled to the redundancy circuitry input.

22. The redundancy circuitry of claim 21 in which the first control circuit comprises:

a transistor having output and control electrodes;

the transistor output electrode being coupled to the several fuse link; and the transistor control electrode being coupled to receive a control signal applied to the redundancy circuitry input.

* * * * *